United States Patent [19]
Zoellick

[11] Patent Number: 6,163,445
[45] Date of Patent: Dec. 19, 2000

[54] LOW-VOLTAGE TEST SIGNAL PATH PROTECTION CIRCUIT WITH EXTENDED BANDWIDTH, OVERVOLTAGE AND TRANSIENT PROTECTION

[75] Inventor: Raymond D. Zoellick, Bothell, Wash.

[73] Assignee: Fluke Corporation, Everett, Wash.

[21] Appl. No.: 09/266,538

[22] Filed: Mar. 11, 1999

[51] Int. Cl.[7] ........................................................ H02H 3/18
[52] U.S. Cl. .............................................. 361/78; 361/113
[58] Field of Search .................................. 361/78, 79, 86, 361/87, 88, 90, 107, 111, 113; 324/115, 110, 76.11

[56] References Cited

U.S. PATENT DOCUMENTS

| 3,611,131 | 10/1971 | Burkhart et al. | 324/115 |
| 3,760,228 | 9/1973 | Uchida | 361/91 |
| 3,875,506 | 4/1975 | Cath et al. | 324/110 |
| 3,970,930 | 7/1976 | Vermolen | 324/98 |
| 5,250,893 | 10/1993 | Gambill et al. | 324/115 |
| 5,379,176 | 1/1995 | Bacon et al. | 361/106 |
| 5,606,481 | 2/1997 | Heep et al. | 361/56 |
| 5,617,284 | 4/1997 | Paradise | 361/58 |
| 5,784,241 | 7/1998 | Munch et al. | 361/111 |

FOREIGN PATENT DOCUMENTS 0 497 478 A2  8/1992  European Pat. Off. .

Primary Examiner—Josie Ballato
Assistant Examiner—Kim Huynh
Attorney, Agent, or Firm—Christen O'Connor Johnson Kindness PLLC

[57] ABSTRACT

An overvoltage and transient protection circuit with extended bandwidth is provided for the protection of a low voltage test signal path (210) such as a test signal path in a multimeter. The disclosed circuit maintains the integrity of a test signal (TS) (114) transmitted by the test signal path (210) by minimizing the effect that unwanted capacitive coupling would otherwise have on the frequency transmission capability of the circuit. During normal operation of the circuit, a test signal path isolation circuit (218) is held between the test signal (TS) (114) and an equivalent buffered guard signal (GS) 227. Held between these equivalent values (TS=GS), no (or minimal) current will be generated in the components of the test signal path isolation circuit (218) as a result of parasitic capacitance. The guard signal (65) (227) is used with guard traces (412) and guard planes (414) to isolate other parts of the test signal path in much the same way. During an overvoltage condition, the test signal path isolation circuit (218) conducts the current resulting from the overvoltage to a clamp circuit (222) that conducts to a voltage limiting circuit. The test signal path (210) may also include a frequency compensated protective resistance (320) that may be relatively high in value.

34 Claims, 4 Drawing Sheets

LOW-VOLTAGE TEST SIGNAL PATH PROTECTION CIRCUIT WITH EXTENDED BANDWIDTH, OVERVOLTAGE AND TRANSIENT PROTECTION

FIELD OF THE INVENTION

This invention relates generally to electronic test instruments, and in particular to a low voltage test path signal protection circuit for an electronic test instrument.

BACKGROUND OF THE INVENTION

Electronic test instruments are used to measure the electrical activity of a circuit and to display that electrical activity to a user in a human recognizable form such as a number on a liquid crystal display (LCD) or a representative graph on a cathode ray tube (CRT). For instance, a commonly used piece of an electronic test instrument known as a multimeter may measure and display electrical activity in terms of voltage, current, resistance, frequency, capacitance and inductance.

A multimeter has a pair of test leads that, by convention, includes a red "signal" lead and a black "common" lead. The red lead is coupled to a selector switch that routes a test signal from a circuit under test to an intermediate circuit that normalizes the test signal before being passed to a measurement circuit. To complete the test circuit, the measurement circuit is also coupled to a common ground that is connected to the black test lead. After measuring the test signal, a display circuit translates the measurement into a human recognizable form and displays that result to the user on a display.

The measurement circuit is typically implemented as an integrated circuit having a plurality of external "pins" that conduct the test signal to the appropriate measurement functions within the integrated circuit. Integrated circuits have inherent operating limitations, such as the range of voltage that can be applied to the integrated circuit's pins without damaging the integrated circuit. To accommodate a wide range of test signals, the selector switch directs the test signal through an intermediate circuit that normalizes the test signal so that the same measurement circuit can be used to measure many different signals. A common technique is to have the selector switch implement "ranges" that, depending on the positioning of the selector switch to an indicated range, directs the test signal to an intermediate circuit associated with that range. The display typically includes an indication of the range selected. For example, a 1000 volt test signal could be measured by selecting a 1000 volt range with the selector switch, while a 10 volt test signal could be measured by selecting a 20 volt range with the selector switch.

In addition to translating the test signal into a form usable to the integrated circuit, the intermediate circuit may also have a protective function that keeps damaging test signals from the integrated circuit. The protection provided by the intermediate circuit is usually a resistor connected in series with the intermediate and measurement circuits to restrict the current flow in those circuits. However, it is not uncommon for the test signal to be directed to an inappropriate intermediate circuit. For instance, a user may knowingly or unknowingly connect the test leads to a 1000 volt test signal while the selector switch is inadvertently set to the 20 volt range. This applies a 1000 volt steady state voltage to the components in the 20 volt range intermediate circuit that will likely damage both the components in that intermediate circuit and the integrated circuit. Unexpected events also may direct a damaging test signal to an inappropriate intermediate circuit and the integrated circuit. For example, if the leads are attached to a motor, the test signal may include an "inductive kick" that transmits a high voltage transient through the test leads when the motor first starts. Damaging voltage transients may also appear on power lines, or even be introduced into circuits under test by static electricity.

One common method of providing protection in an intermediate circuit is to place one or more "protective" resistors in series in the test signal path (also called a measurement path). These series resistors dissipate excess voltages as heat in a relationship well known in the art and limit the current that reaches the integrated circuit. The use of protective resistors, however, involves tradeoffs that may effect the accuracy of the measurement of the test signal. For example, the protective resistor's own resistance interacts with resistor's own parasitic capacitance, the parasitic capacitance of the integrated circuit's pins, the capacitance caused by the traces on the circuit board, and other undesirable capacitive coupling, to create a low pass filter that attenuates higher frequency components of the test signal. While a larger protective resistance is desirable because it drops the signal voltage and limits the current to values that are less likely to damage the measurement circuit, the larger the protective resistance, the greater the attenuation of the higher frequencies. (The frequency passing ability of the resistor is inversely proportioned to the resistance of the resistor.) Therefore, prior art methods that use protective resistors require a compromise between the ability of the protective resistor to protect the circuit and the ability to pass an extended bandwidth of test signals.

Examples of methods employed to compensate for the loss of bandwidth caused by adding a protective resistance in series with the test signal path are found in the Fluke 87 and Fluke 8060 digital multimeters manufactured by Fluke Corporation, Everett, Wash. In the Fluke 87, a first test signal path contains a very large value series resistor protecting the measurement circuit. To compensate for the frequency rolloff caused by this large value series resistor, a second, parallel, test signal path is provided that employs a lower value resistor in series with a coupling capacitor that extends the frequency bandwidth of the intermediate circuit by passing some of the higher frequencies to the measurement circuit. This solution provides a greater frequency bandwidth, but has the attendant problems of compensation matching and the introduction of thermal noise caused by the very high value resistor.

In the Fluke 8060 a lower resistance in the intermediate path results in the an extended bandwidth, but at the expense of not providing greater overvoltage protection. A higher value protective resistor is used near the end of the test signal path close to the measurement circuit. The test signal path from the protective resistor to the integrated circuit containing the measurement circuit is then shielded from stray capacitance using a protective voltage that follows the test signal present on the test signal path. While this method extends the bandwidth of the circuit, it comes at the price of overvoltage protection limited to approximately 20 seconds.

It would be desirable to provide a circuit that combines a high level of protection against steady-state overvoltage and voltage transient conditions while maintaining the ability to pass test signals within an extended bandwidth. Preferably, the circuit would be able to withstand a continuous (steady-state) overvoltage for an extended period of time as well as short period voltage transients. The circuit would also preferably isolate the test signal path from the capacitive coupling that would otherwise adversely effect the test signal path's frequency transmission ability. The present invention is directed to such a circuit.

SUMMARY OF THE INVENTION

In accordance with the present invention, an extended bandwidth low voltage protection circuit is provided for protecting against overvoltage conditions and voltage transients that may appear in a test signal carried through a test signal path. The extended bandwidth low voltage protection circuit includes a capacitance isolation circuit that isolates the test signal path from capacitive coupling that might otherwise adversely affect the frequency transmission ability (bandwidth) of the test signal path. If the extended bandwidth low voltage protection circuit detects an overvoltage condition or voltage transient in the test signal conducted by the test signal path, the circuit conducts the overvoltage or voltage transient to a clamp circuit that then couples the inside end of the test signal path to voltage limiting devices or circuits that keep the measurement circuitry from being damaged.

In accordance with other aspects of the invention, the capacitance isolation circuit includes a test signal path isolation circuit and a guard signal circuit. The test signal path isolation circuit includes a pair of reciprocally arranged diodes with a first cathode of a first diode and a second anode of a second diode coupled to the test signal path, forming an interior node. The guard signal circuit samples the test signal being transmitted on the test signal path and produces a buffered guard signal that replicates the test signal. The guard signal is coupled to a first anode of the first diode at a low side exterior node. The guard signal is also coupled to a second cathode of the second diode at a high side exterior node. These connections place the first and second diode between the test signal (at the interior node) and the guard signal (at either the high side exterior node or the low side exterior node). While the test signal remains within an upper signal limit and a lower signal limit, the guard signal will follow the test signal and the first and second diodes will not experience a differential across their junctions because one side of the junction is attached to the test signal and the other side of the junction is attached to the equivalent guard signal. Without a differential between the test signal and the guard signal, the parasitic capacitance across the junctions of the first and second diodes does not reduce the bandwidth of the test signal path. The test path isolation circuit also serves to isolate the test signal path from stray capacitance produced by the circuitry attached to the high side exterior node and the low side exterior node.

In accordance with further aspects of the invention, the clamp circuit includes a third diode that has a third anode coupled to a low clamp path and a third cathode coupled to the low side exterior node. The clamp circuit also includes a fourth diode with a fourth cathode coupled to a high clamp path and a forth anode connected to the high side external node of the capacitance isolation circuit. When an overvoltage or voltage transient is present in the test signal, the test signal path isolation circuit conducts the overvoltage or voltage transient to the clamp circuit if the test signal exceeds an upper signal limit or a lower signal limit by one diode drop (approximately 0.6 volts) from either the upper signal limit or the lower signal limit. Primarily, the clamp circuit will cause the overvoltage or voltage transient to be dissipated in the test signal limiting circuits components when the test signal exceeds two diode drops (approximately 1.2 volts) from either the upper signal limit or lower signal limit. It is preferable that the clamp circuit contains components rated to handle the current of a reasonably anticipated voltage transient or a steady state overvoltage for an extended period of time.

In accordance with yet other aspects of the invention, a test signal limiting circuit is connected in series in the test signal path and includes protective resistors each having a relatively high resistance value. The protective resistors are frequency compensated by connecting a capacitor in parallel with each protective resistor. Without the capacitor, the frequency bandwidth of the test signal path would be limited to passing relatively low frequencies because the protective resistor acts like a low pass filter that is formed by the interaction of the high resistance of the protective resistor with the inherent parasitic capacitances of the test signal path. The capacitor passes the higher frequency components of the test signal that would otherwise be attenuated by the protective resistor. Preferably, several protective resistors are connected in series in the test signal path, so that the protective resistors form a voltage divider that proportionally distributes the overvoltage or voltage transient, thereby keeping the power dissipation of each resistor within its wattage rating.

In accordance with other aspects of the invention, the guard signal is connected to one or more circuit board guard traces that run alongside (including above and/or below when using a multi-layer circuit board) a test signal path circuit board trace that conducts the test signal. This advantageous placement of guard traces next to the test signal path traces isolates the test signal from the effects of unwanted capacitive coupling in much the same manner as described above for the test signal path isolation circuit. In other words, because the present invention maintains the guard signal equal to the test signal, there is no differential between the test signal carried on the test signal path and the guard signal carried on the guard signal trace. Without a differential between the test and guard signal, the capacitance formed between the test signal path trace and the guard signal path trace has minimal effect on the frequency bandwidth of the test signal path.

In accordance with still further aspects of the invention, a surge protection circuit preferably precedes the extended bandwidth low voltage protection circuit to shield it from very high voltage transients and overvoltage conditions. Many suitable surge protection circuits are known in the art. For example, a suitable surge protection circuit may include two protective resistors totaling approximately 5k ohms connected in series within the test signal path, followed by two metal oxide varistors (MOVs) that are connected in series between the test signal path and a common ground. It is also preferable to further protect the extended bandwidth low voltage protection circuit by including a switch that disrupts the test signal path when the measurement circuit is not in use. This switch may be an independent switch, a part of a manual selector switch or may be controlled by automatic ranging controls that are well-known in the art.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 1:
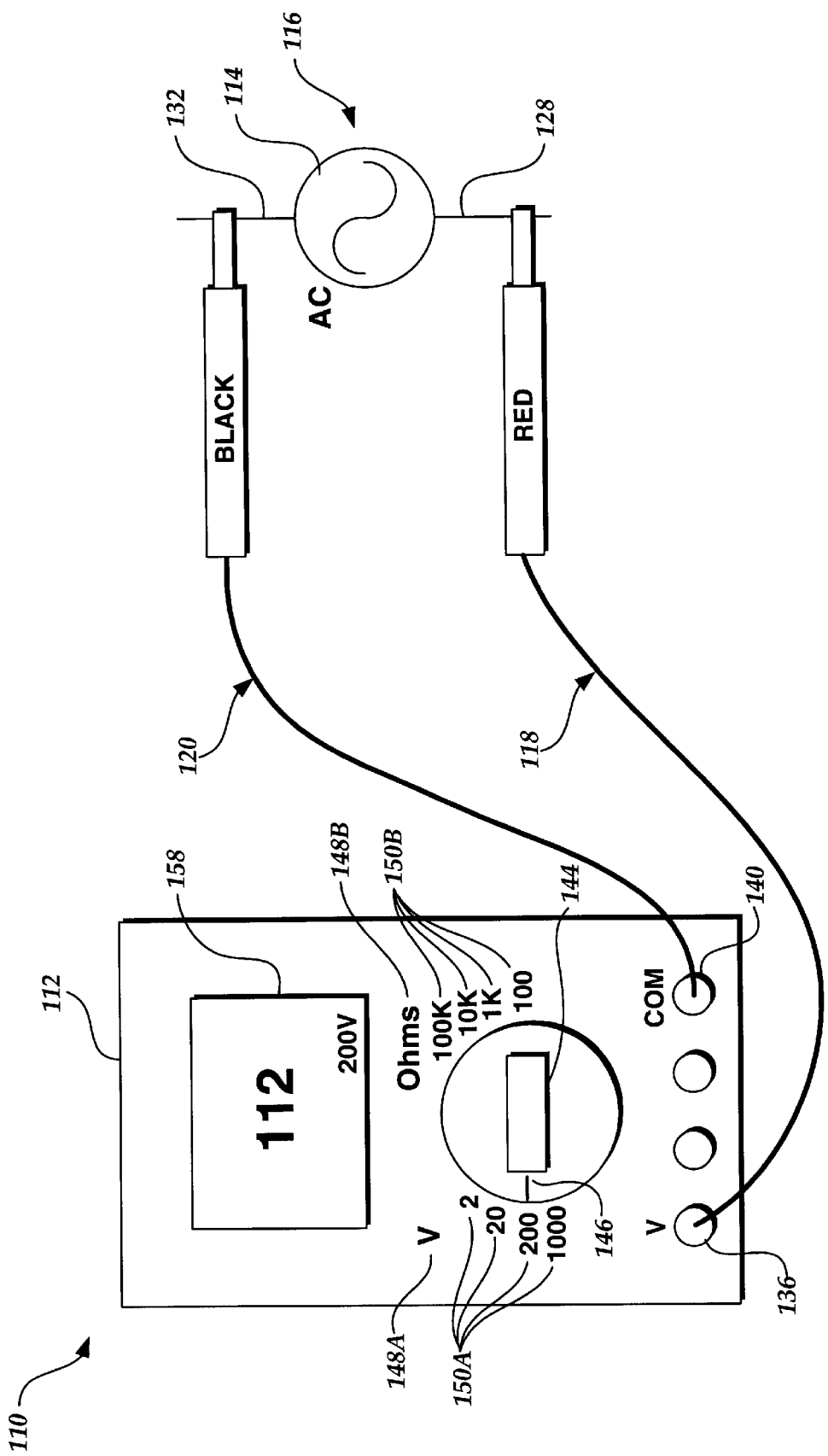
FIG. 1 is a schematic representation of a digital multimeter suitable for employing the circuit of the present invention.

FIG. 1 is a somewhat schematic plan view of a unit of electrical test equipment 110 commonly referred to as a multimeter 112. The multimeter 112 samples a test signal 114 from a circuit under test 116. The multimeter 112 acquires the test signal 114 through a pair of test leads 118 and 120. By convention, test lead 118 is colored red and test lead 120 is colored black. Red test lead 118 conducts a test signal side 128 of the circuit under test 116 to a test signal input (V) 136 and the black test lead 120 connects a common reference side of the circuit under test 116 to a common input connector (COM) 140 of the multimeter 112.

The multimeter 112 has a selector switch 144 that rotates a selector mark 146 to indicate the function 148A–B and range 150A–B selected by the selector switch 144. A range 150A–B indicates the full-scale test signal value that can be measured in that range. Each function has a set of separately selectable ranges 150A–B. The selector switch 144 is used to select a function 148A, 148B and a range 150A–B appropriate to the test signal 114. Many multimeters use the selector switch to select the function 148A–B, with the range chosen automatically by the meter or manually by the user through push-button selections.

The test signal (TS) 114 is conducted from the circuit under test 116, through the red test lead 118, to the signal input connector 136, which is connected to the test signal path 210. The test signal path 210 is indicated by the bold arrows in FIG. 2. Those persons skilled in the art will recognize that the test signal (TS) 114 may comprise of a number of different attributes that may be measured such as voltage, current and frequency. Using two of the extended bandwidth low voltage protection circuits described herein, the phase of the test signal (TS) 114 may be measured relative to another test signal.

While not required to practice the invention, there is preferably a surge protection circuit 212 (FIG. 2) connected in series within the test signal path 210 between the test signal connector 136 and the selector switch 144 (SW1). The purpose of the surge protection circuit 212 is to protect the selector switch 144 and all subsequent circuits, including the present invention, from very high voltages that could damage the components in those circuits. An example of a surge protection circuit 212 is discussed below with reference to FIG. 3. While many standard surge protection circuits known in the art may be used, the surge protection circuit 212 preferably has a relatively low resistance so as not to greatly effect the frequency transmission capability (bandwidth) of the test signal path 210.

Figure 2:
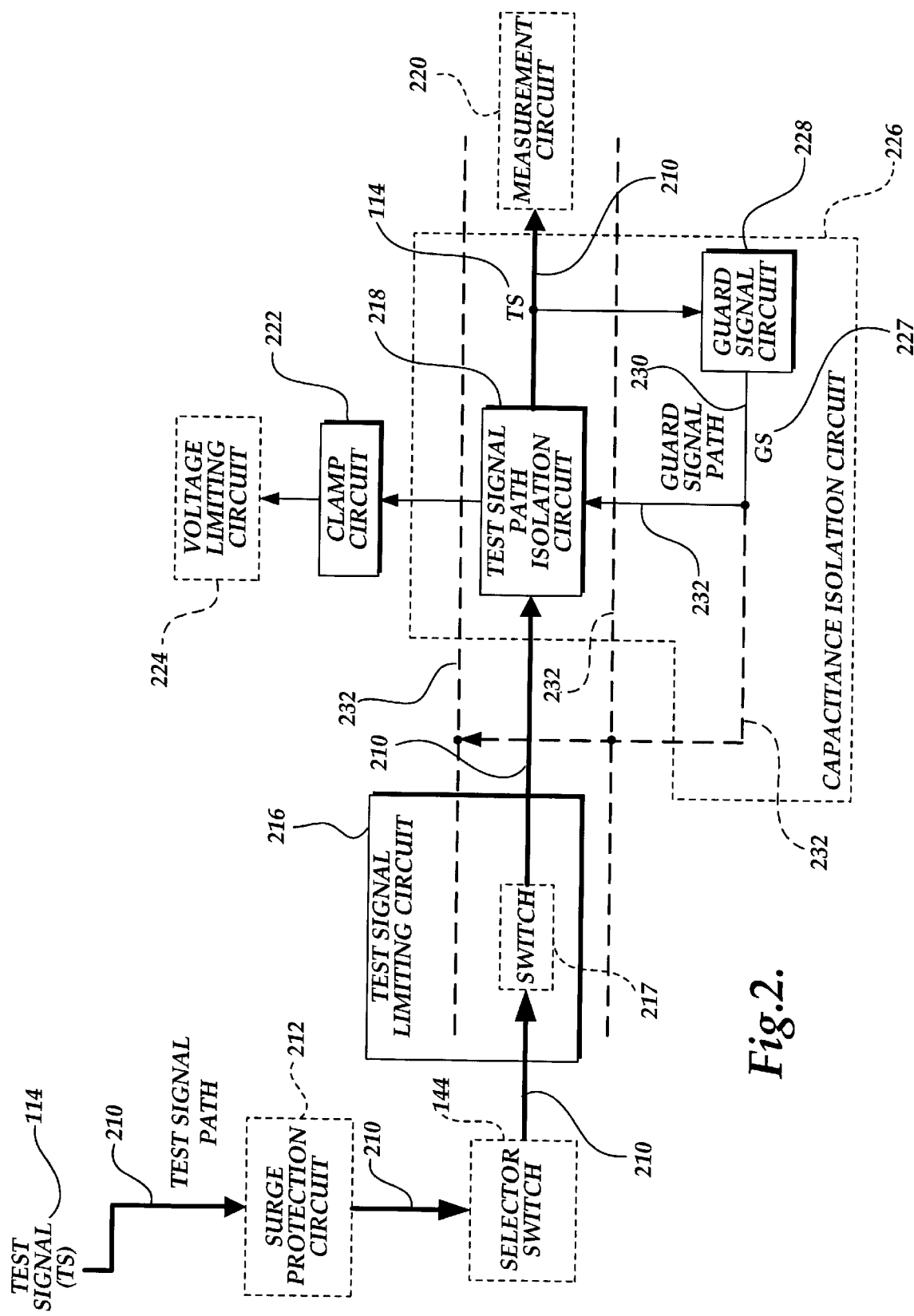
FIG. 2 is a block representation of the subcircuits which make up the present invention together with example input and output circuits.

The test signal path 210 conducts the test signal (TS) 114 from the surge protection circuit 212 to the selector switch 144. When the selector switch 144 is set to select the intermediate circuit that includes the present invention, the test signal 114 is coupled through a continuation of the test signal path 210 to a test signal limiting circuit 216. The test signal limiting circuit 216 inserts a frequency compensated protection resistance in series in the test signal path 210. The purpose of the protection resistance in the test signal limiting circuit 216 is to limit test signal voltage and current that may damage circuits that follow the test signal limiting circuit 216 on the test signal path 210, such as measurement circuit 220. The test signal limiting circuit 216 may include a switch 217 that interrupts the test signal path 210 when a different intermediate circuit is selected (e.g., with selector switch 144) and that closes the test signal path 210 when the intermediate circuit illustrated in FIG. 2 is being used. The switch 217 may be part of the selector switch 144.

The test signal limiting circuit 216 is connected in series by the test signal path 210 with a test signal path isolation circuit 218. In normal operation, the test signal path isolation circuit 218 keeps the clamp circuit 222 invisible to the test signal path 210, and the test signal 114 is passed along the test signal path 210 to a subsequent function, such as a measurement circuit 220, which measures the test signal (TS) 114 and sends a representation of the measurement to the display 158. When the test signal path isolation circuit 218 detects a steady-state overvoltage or a short-term voltage transient, the test signal path isolation circuit 218 conducts the overvoltage or voltage transient to the clamp circuit 222. If the overvoltage or transient voltage is greater than a predetermined upper signal limit or a lower signal limit, the clamp circuit 222 couples the overvoltage or voltage transient to a voltage limiting circuit 224.

As mentioned above, the test signal path isolation circuit 218 helps isolate other circuitry from the test signal path 210 while the circuit is in normal operation. Normal operation is defined as having a test signal (TS) that is between the predefined upper signal limit and the lower signal limit. The test signal path isolation circuit 218 isolates the test signal path 210 in that the test signal path isolation circuit 218 inhibits capacitive coupling of parasitic capacitance from its own components and the capacitance of those circuits which follow the test signal path isolation circuit 218. If the test signal path isolation circuit 218 did not isolate the test signal path, the frequency passing ability of the test signal path 210 would be reduced by the capacitance coupled to the test signal path, which interacts with the resistive elements in the test signal path 210 to form a low pass filter that might not pass all of the constituent frequencies of the test signal 114.

The test signal path isolation circuit 218 is part of a capacitance isolation circuit 226. The capacitance isolation circuit 226 includes a guard signal circuit 228 which samples the test signal (TS) 114 from the test signal path 210 to produce a guard signal (GS) 227 at a guard signal output 230. The guard signal (GS) 227 is applied by way of a guard signal path 232 to an outside node of the test signal path isolation circuit 218. During normal operation, the test signal path isolation circuit's 218 components are held between the test signal (TS) 114 and the equivalent guard signal (GS) 227. (As mentioned above, the test signal path 210 is coupled to an inside node of the test signal path isolation circuit 218). By holding the test signal path isolation circuit 218 between the equivalent guard signal (GS) 227 and test signal (TS) 114, there is no voltage differential to induce a current into the test signal path as a result of capacitive coupling. In other words, the capacitive coupling is described by the function $$I = C \frac{dV}{dT},$$

where I equals the current produced, C equals the capacitance of the circuit, dV is the change in voltage, and dT is the change in time. If the change in voltage (dV) is held to zero by keeping GS=TS, no current is induced into the test signal path 210, effectively resulting in no capacitive loading from the test signal path isolation circuit 218. The test signal path isolation circuit 218 also serves to isolate the capacitance of the clamp circuit 222 connected to the outside node from the test signal path 210.

The guard signal (GS) 227 produced at the guard signal output 230 is coupled to a guard path 232 that shields the test signal path 210 from capacitive coupling that may be introduced from circuit elements such as adjacent circuit board traces. The guard path operates in a manner similar to that described above with reference to the test signal path isolation circuit 218 by eliminating a voltage differential between adjacent circuit board traces and the test signal path 210. The guard path 232 is described in detail below with reference to FIG. 4.

Figure 3:
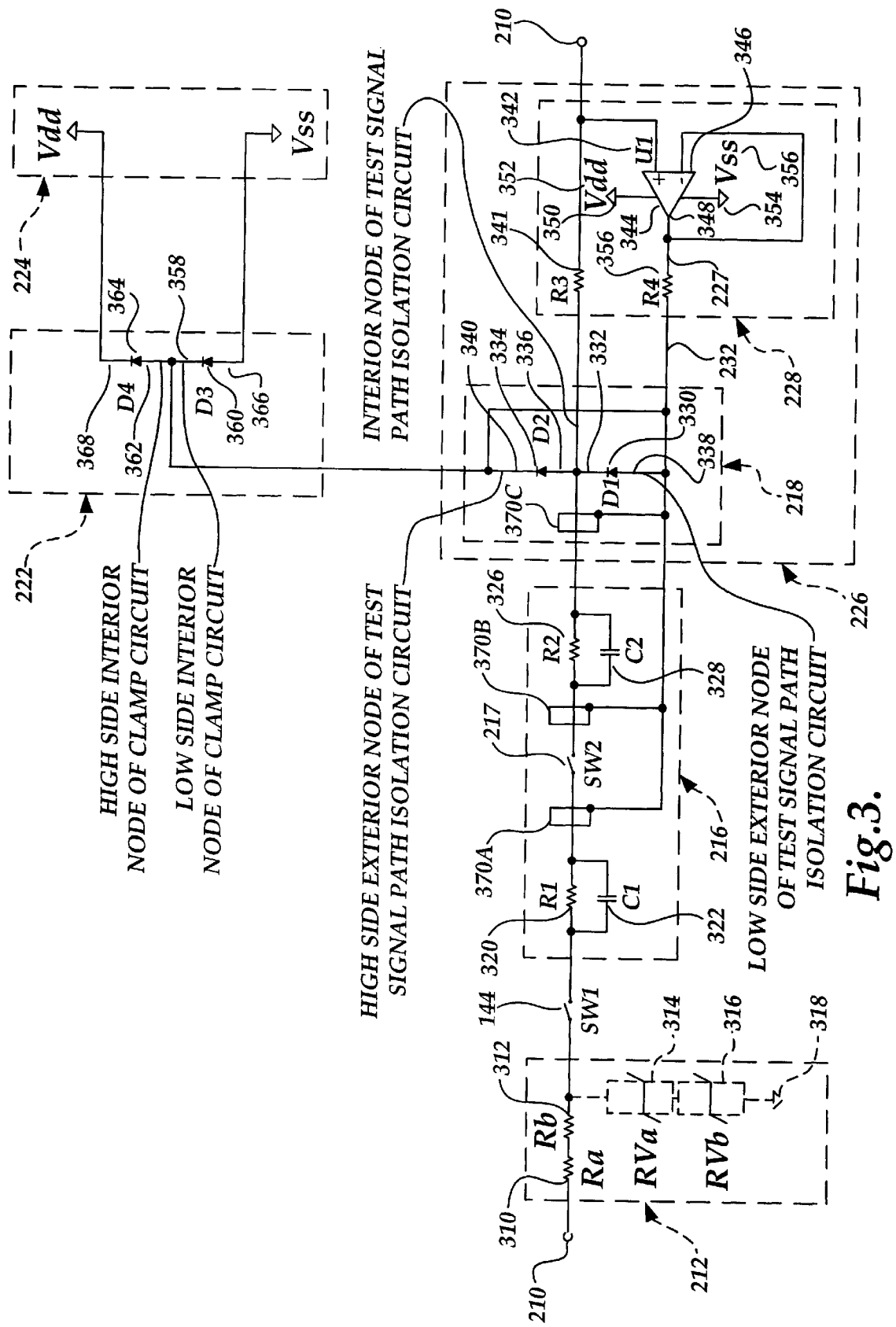
FIG. 3 is an electronic schematic of an actual embodiment of the present invention.

An actual embodiment of the present invention is shown in the detailed electrical schematic shown in FIG. 3. The test signal 114 is preferably applied to the surge protection circuit 212 at a first side of a resistor (Ra) 310. A second side of the resistor (Ra) 310 is coupled in series with a first side of a resistor (Rb) 312. A second side of the resistor (Rb) 312 is connected to a first side of a metal oxide varistor (RVa) 314, which has a second side that is connected to a first side of a second metal oxide varistor (RVb) 316. The second side of the metal oxide varistor (RVb) is connected to a common ground 318. The resistance values of resistor (Ra) 310 and resistor (Rb) 312 are preferably relatively low so that the resistors (Ra) 310 and (Rb) 312 limit the test signal 114 in the test signal path 210 somewhat, but avoid the frequency rolloff associated with larger resistors. The series combination of the MOV (RVa) 314 and MOV (RVb) 316 do not conduct during the regular operation of the circuit, but will shunt high voltages to the common ground 318 when necessary. As mentioned above, the surge protection circuit 212 illustrated is only one form of a surge protector, and other configurations may be used as long as the interference with the normal frequency transmission capability of the test signal path 210 is kept to a minimum.

Following the resistor (Ra) 310 and the resistor (Rb) 312, the test signal path couples with the selector switch (SW1) 144, which can be set to couple to the test signal limiting circuit 216. The test signal limiting circuit 216 has a resistor (R1) 320 with a relatively high resistance. The test signal path 210 has inherent parasitic capacitance that, when combined with the resistance of the resistor (R1) 320, forms a low pass filter that will attenuate higher frequencies. The larger the value of this resistor, the earlier (lower frequency) the attenuation of the higher frequencies. The attenuation of higher frequencies on the test signal path 210 is often referred to as the "frequency rolloff" of the test signal 114. In order to compensate for this frequency rolloff, a capacitor (C1) 322 is connected in parallel with the resistor (R1) 320.

The parallel resistor (R1) 320 and capacitor (C1) 322 are preferably coupled to a switch 217 that interrupts the test signal path 210 when the multimeter 112 performs functions that do not require this particular test signal path 210. When the switch (SW2) 217 is closed, the test signal path 210 connects with a second resistor (R2) 326 and a second capacitor (C2) 328 that are coupled in parallel, in order to extend the bandwidth of the resistor (R2) 326 in the same manner as was just described for the resistor (R1) 320 and capacitor (C1) 322 combination. Together, the series combination of the resistor (R1) 320 and the resistor (R2) 326 will divide and dissipate overvoltage and voltage transients as heat in a manner well know in the art. The resistor (R1) 320 and the resistor (R2) 326 should have a high enough wattage rating to cover the current at steady state that can be reasonably anticipated to be present on the test signal path 210 when an overvoltage or voltage transient is encountered in the test signal 114.

The test signal path 210 couples with the capacitance isolation circuit 226 following the resistor (R2) 326 and capacitor (C2) 328 combination in the test signal path 210. The capacitance isolation circuit 226 contains a test signal path isolation circuit 218 that comprises a first diode (D1) 330 that has a first cathode 332 connected to the test signal path 210 and a second diode (D2) 334 that has a second anode 336 connected to the test signal path 210. A first anode 338 of the first diode (D1) 330 and a second cathode 340 of the second diode (D2) 334 are connected through resistor (R4) 356 to the guard signal (GS) 227 that is produced by the guard signal circuit 228.

The guard signal circuit 228 includes a protective resistor (R3) 341 that is coupled in series between the test signal path 210, the measurement circuit 220 and the noninverting input 342 of an operational amplifier (U1) 344. An inverting input 346 of the operational amplifier (U1) 344 is connected to the output 348 of the operational amplifier (U1) 344 to form a negative feedback loop. The operational amplifier (U1) 344 has a high side power connection 350 that is connected to a high side power supply (Vdd) 352 and a low side power connection 354 that is connected to a low side power supply (Vss) 356. Configured in this manner, the operational amplifier 344 becomes a noninverting, unity gain (i.e., gain=+1) follower. The output 348 of the operational amplifier (U1) 344 produces a guard signal 227 that follows the test signal 114 between an upper signal limit that approaches the high side power supply (Vdd or the "upper rail") 352 and a lower signal limit that approaches the low side power supply (Vss or the "lower rail") 356. The slew rate and/or large signal bandwidth of the operational amplifier 344 determines the upper frequency limit of the guard signal circuit 228.

The guard signal (GS) 227 appearing at the output 348 of the operational amplifier (U1) 344 is coupled through a series resistor (R4) 356 to the first anode 338 of the first diode (D1) 330 and the second cathode 340 of the second diode (D2) 334. The first anode 338 of the first diode (D1) 330, the second cathode 340 of the second diode (D2) 334 and the guard signal path 232 are also connected to the clamp circuit 222 at a junction formed by a third cathode 358 of a third diode (D3) 360 and a fourth anode 362 of a fourth diode (D4) 364. A third anode 361 of the third diode (D3) 360 is coupled to the low side power supply (Vss) and a fourth cathode 368 of the fourth diode (D4) 364 is coupled to the high side power supply (Vdd).

The voltage limiting circuit 224 is made up of the Vdd and Vss supplies, possibly in combination with zener clamp diodes (not shown) that keep the supply voltages from exceeding specific voltage limits. This is to prevent damage from excessive voltages.

Resistors R3 341 and R4 356 serve to protect the guard signal circuit 228 and the measurement circuit 220 from steady-state or transient overvoltages in combination with the test signal path isolation circuit 218 and clamp circuit 222.

Figure 4:
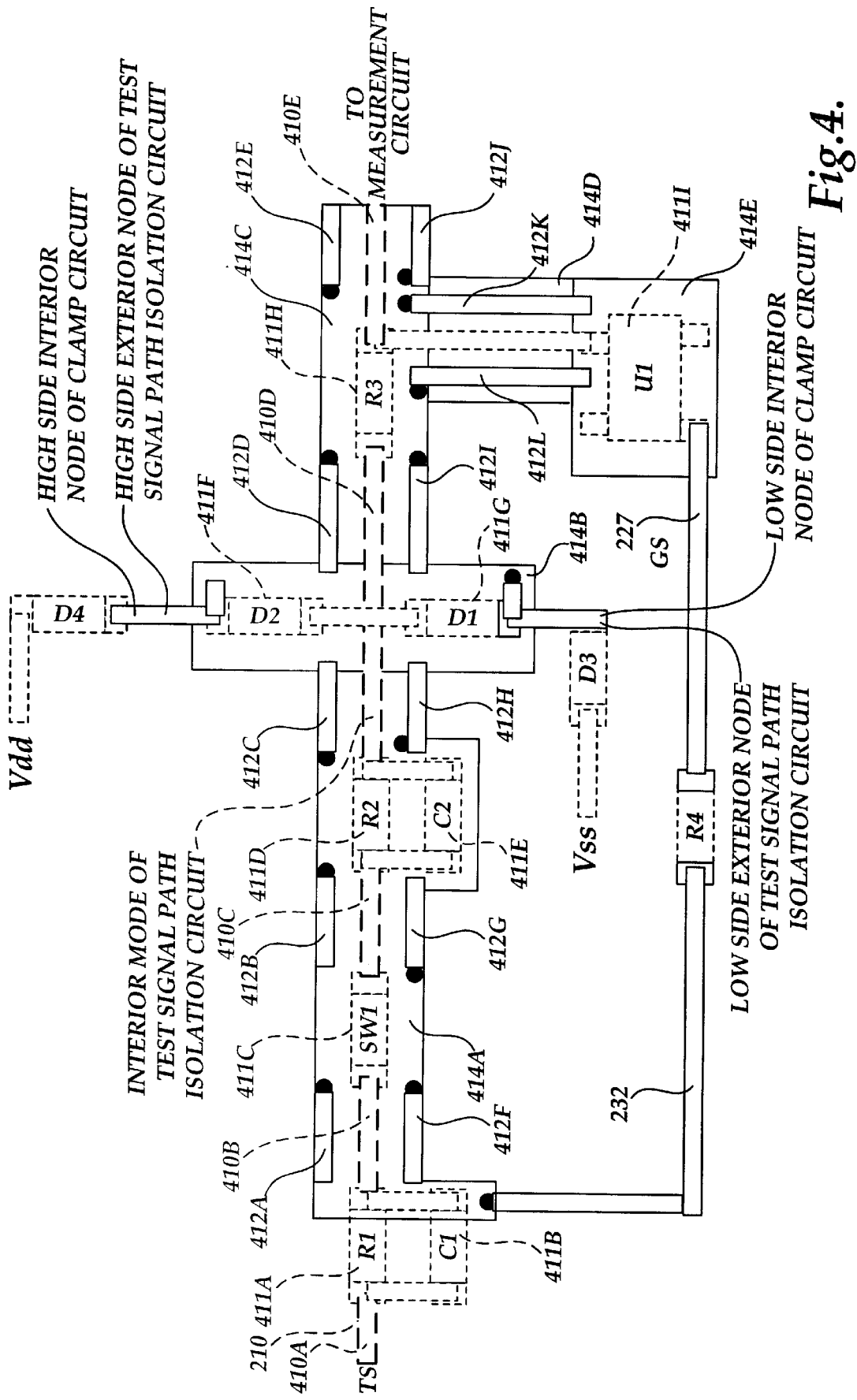
FIG. 4 is an exemplary circuit board layout in accordance with the present invention.

The guard signal 227 is also applied through resistor (R4) 356 to a plurality of guard signal paths 370A, 370B, and 370C. The purpose of the guard signal paths 370A, 370B, and 370C is to help isolate the test signal path 210, as illustrated in FIG. 4. The guard signal (GS) 227 coupled to the guard signal path 232 (guard signal paths 370A, 370B, 370C) isolates the test signal path 210 from capacitive coupling in a manner similar to that described above with reference to the test signal path isolation circuit 218. The test signal path 210 is indicated in FIG. 4 by the bold dashed lines, while the components and their interconnections are shown in dashed lines. A guard path is shown by the solid lines in FIG. 4.

In FIG. 4, the test signal 114 is conducted through the test signal path 210 by a series of traces 410A–E. A circuit board trace is a conductor found on a circuit board usually comprising a copper strip that lays flat on a layer of a circuit board. A circuit board may have many layers, each layer with a plurality of traces that each carry a signal. The proximity of two circuit board traces (conductors) separated by a dielectric (the circuit board material) form a capacitor.

The present invention protects against proximate traces capacitively coupling to the test signal path traces 410A–E by "guarding" the test signal path traces 410A–E with guard traces 412A–L. In addition to guarding the test signal path traces 410A–E, the components in the circuit are also guarded by a guard plane 414A–E. The guard planes 414A–E and the guard traces 412A–L are coupled to the guard signal that is carried by the guard path 232. In an actual embodiment of the invention, the guard plane 414A–E is an inner circuit board (conductive) layer that is interposed between the test signal path traces and components and other proximate circuit board traces, including a ground layer.

In much the same way as is described above with regard to the test signal isolation circuit 218 (FIG. 2), the test signal path traces 410A–E and the circuit board components 411A–I coupled to the test signal path are capacitively guarded from other conductors on the circuit board by interposing the guard plane 414A–E. This guard plane is connected to guard signal (GS) 227, which is substantially equivalent to the test signal (TS) 114 within the operating bandwidth of the guard signal circuit. Since there is no voltage differential (dV=0) between the guard planes 414A–E and the circuit board components 411A–I, no significant error current is introduced into the measurement path as a result of capacitive coupling.

The operation of the present invention is illustrated by the following two examples.

EXAMPLE 1

Normal Operation Mode

To illustrate the normal operation of the present invention, assume that a 50,000 Hz AC test signal with a peak-to-peak amplitude of 1 volt is measured by the multimeter 112. The red test lead 118 conducts the test signal to the TS terminal 136 of the multimeter which is connected to the test signal path 210 through the surge protection circuit 212. Assuming that an intermediate path containing the present invention is selected with the selector switch (SW1) 144 and the switch (SW2) 217 both closed, the test signal will be coupled along the test signal path 210. Without the capacitor (C1) 322 and the capacitor (C2) 328 that are coupled in parallel with the resistor (R1) 320 and the resistor (R2) 326, respectively, the relatively high protective resistance provided by the resistor (R1) 320 and the resistor (R2) 326, in combination with the parasitic capacitances, would only pass frequencies along the test signal path 210 that are well below the several hundred kHz requirement of the test signal 114. With the capacitor (C1) 322 and the capacitor (C2) 328 in position, however, the transmission of the 50 kHz signal along the test signal path 210 is significantly aided.

As the test signal 114 is passed from the test signal limiting circuit 216, it is coupled to the guard signal circuit 228, with the guard signal (GS) 227 generated at the output 348 of the operational amplifier 344. Assuming the operational amplifier (U1) 344 has an upper rail 352 of +5 volts and a lower rail 356 of –5 volts, and given the test signal of 1 volt peak-to-peak, the guard signal circuit 228 will produce a 1 volt peak-to-peak guard signal (GS) 227 at its output 348 that "follows" the test signal 114, with higher frequencies only limited by the slew rate or bandwidth of the operational amplifier 344. This guard signal (GS) 227 is applied to the outside node of the test signal path isolation circuit (i.e., the first anode 338 and the second cathode 340), while the test signal 114 is applied to the inside node of the test signal path isolation circuit (i.e., the first cathode 332 and the second anode 336). Since there is no difference in voltage across either the first diode (D1) 330 or the second diode (D2) 334, neither diode will conduct the test signal to the clamp circuit 222. Also, because there is no change in voltage (dV) between the test signal (TS) 114 and the guard signal (GS) 227, the capacitances of the diodes (D1 and D2) do not affect the test signal path 210, and the stray capacitance from subsequent circuits coupled through the outside node, such as the clamp circuit 222, is effectively blocked. Also, the guard signal paths 370A, 370B, and 370C effectively block out or "guard away" other parasitic capacitances to the test signal path 210.

EXAMPLE 2

Overvoltage or Voltage Transient

To illustrate the operation of the present circuit when an overvoltage or voltage transient is applied to the test signal path 210, assume that the test signal 114 has an amplitude of 500 volts peak-to-peak. Also assume that the operational amplifier (U1) is connected to an upper rail (Vdd) 352 that is equal to +5 volts and a lower rail (Vss) 356 that is equal to –5 volts. Omitting other resistance that may be present in the test signal path 210 for this example, the first protective resistor (R1) 320 and the second protective resistor (R2) 326 in series will dissipate the power resulting from the voltage dropped across the resistors by converting it to heat. The test signal (TS) 114 is coupled to the noninverting input 342 of the operational amplifier 344 in the guard signal circuit 228. During the positive portion of the test signal 114, the operational amplifier 344 will attempt to duplicate the 500 volt positive amplitude of the test signal, but will be limited by the +5 volt upper voltage rail (Vdd) 352. This will apply at most +5 volts to guard signal (GS) 227. When the test signal reaches +5.6 volts, the second diode (D2) will begin conducting current to the fourth anode 362 of the fourth diode (D4) 364 and to the guard signal path 232 end of resistor (R4) 356. When the test signal (TS) 114 reaches 6.2 volts or two diode drops above the upper voltage rail 352, then D4 will begin conducting current that will be conducted through the voltage limiting circuit 224 to Vdd. Some current will also be conducted through resistor (R4) 356 to the +5 volt or so guard signal (GS) 227.

A reciprocal action occurs during the negative portion of the test signal 114. When the test signal reaches –5.6 volts, the first cathode 332 of the first diode (D1) 330 will be forward biased by one diode drop with respect to the guard signal (GS) 227, which will reach its maximum negative value at near the lower rail (Vss) 356 (–5 volts). When the test signal reaches –6.2 volts, the third cathode 358 of the third diode (D3) 360 will be forward biased by one diode drop with respect to Vss and will begin conducting, which will discharge the current through diodes (D1) 330 and (D3) 360 to the voltage limiting circuit 224.

In summary, the test signal path isolation circuit 218 will conduct the current associated with an overvoltage situation to the clamp circuit 222 when the test signal 114 is more positive than Vdd or more negative than Vss by a single diode drop. The clamp circuit 222 will conduct the current associated with the overvoltage condition to the voltage limiting circuit 224 when the test signal 114 is more positive than Vdd or more negative than Vss by two diode drops. The limitation of the current by the protective resistors R1 and R2 regulates the current discharged through the diodes to a quantity that is well within their rated capacity. This means that the diodes will be able to conduct current at steady state for long periods of time.

While the preferred embodiment of the invention has been illustrated and described, it will be appreciated that various changes can be made therein without departing from the spirit and scope of the invention. For instance, it will be appreciated by one skilled in the art that, while described above to protect the test signal path from both positive and negative overvoltage and voltage transients, in some applications it may be necessary to only protect against positive overvoltages or voltage transients (e.g., diodes D2 334 and D4 364), or against negative overvoltages and voltages transients (i.e., using diode D1 330 and D3 360). Also, the voltage limiting circuit 224 could be made up of zener diodes or other voltage limiting devices that limit at lower voltages than Vdd and Vss.

What is claimed is:

1. An extended bandwidth low voltage protection circuit for protecting a test signal path from overvoltages and voltage transients appearing in a test signal being conducted by the test signal path, comprising:
  a guard signal circuit having an input coupled to the test signal path for producing a guard signal that replicates the test signal between an upper signal limit and a lower signal limit; and
  a test signal path isolation circuit having an interior side that is electrically coupled to the test signal path, the test signal isolation circuit having an exterior side coupled to receive the guard signal; and
  the test signal isolation circuit, operating such that:
    while the test signal is between the upper signal limit and the lower signal limit, the guard signal replicates the test signal, the test signal isolation circuit does not conduct current, and there is no material signal differential between the interior side and the exterior side of the test signal isolation circuit; and
    while the test signal is not between the upper signal limit and the lower signal limit, the guard signal does not replicate the test signal and the test signal isolation circuit conducts current.

2. The protection circuit of claim 1, further comprising:
  a clamp circuit having an electrical capacitance, the clamp circuit comprising:
    a high interior side of the clamp circuit that is coupled to the high exterior side of the test signal path isolation circuit;
    a low interior side of the clamp circuit that is coupled to the low exterior side of the test signal path isolation circuit;
    a high exterior side of the clamp circuit that is coupled to a high side of a voltage limiting circuit; and
    a low exterior side of the clamp circuit that is coupled to a low side of the voltage limiting circuit; and
  whereby the test signal path isolation circuit isolates the electrical capacitance of the clamp circuit from the test signal path unless the test signal path isolation circuit detects excessive voltage on the test signal path and conducts the resulting current to the clamp circuit which shunts the current to the voltage limiting circuit.

3. The protection circuit of claim 2 wherein the capacitance isolation circuit further comprises a first electrically-conductive guard path positioned on a first side of the test signal path, the first electrically-conductive guard path being coupled to the guard signal.

4. The protection circuit of claim 3 further comprising:
  a test signal limiting circuit, comprising:
    a first protective resistor electrically coupled in series in the test signal path; and
    a first bandwidth-extending capacitor coupled in parallel with the first protective resistor.

5. The protection circuit of claim 4, further comprising a second electrically-conductive guard path positioned on a second side of the test signal path, the second electrically-conductive guard path being coupled to the guard signal.

6. The protection circuit of claim 5 wherein the test signal isolation circuit comprises:
  a first diode having a first cathode coupled to the test signal path and a first anode coupled to the guard signal; and
  a second diode having a second anode coupled to the test signal path and a second cathode coupled the guard signal.

7. The protection circuit of claim 6 wherein the clamp circuit comprises:
  a third diode having a third anode coupled to the low voltage clamp circuit and a third cathode that is coupled to the guard signal; and
  a fourth diode having a fourth cathode coupled to the high voltage clamp circuit and a fourth anode that is coupled to the third cathode of the third diode.

8. The protection circuit of claim 7 wherein the guard signal circuit comprises a non-inverting unity buffer circuit having an input coupled to the test signal path and an output that produces a buffered equivalent of the test signal.

9. The protection circuit of claim 8 wherein the non-inverting unity buffer circuit comprises:
  a power supply having a high supply side and a low supply side;
  an operational amplifier, having:
    a high side power connection coupled to the high supply side of the power supply;
    a low side power connection coupled to the low side of the power supply;
    a non-inverting input coupled to the test signal path through a third protective resistor coupled in series between the test signal path and the non-inverting input;
    an output coupled to the first anode of the first diode and the second cathode of the second diode, the output being the guard signal that is coupled to the first anode of the first diode and the second cathode of the second diode through a fourth protective resistor that is connected in series between the output and the first anode of the first diode and the second cathode of the second diode; and
    a inverting input coupled to the output.

10. The protection circuit of claim 9 wherein the test signal limiting circuit further comprises:
  a second protective resistor electrically coupled in series in the test signal path; and
  a second bandwidth-extending capacitor coupled in parallel with the second protective resistor.

11. The protection circuit of claim 10 wherein the test signal limiting circuit further comprises a switch that breaks the test signal path when open so that the test signal is not applied to the capacitance isolation circuit and the guard signal circuit.

12. The protection circuit of claim 11 wherein the upper signal limit is based on the high side power connection and the lower signal limit is based on the low side power connection.

13. The protection circuit of claim 12 wherein the low voltage limiting circuit is coupled to the low supply side of the power supply and the high voltage limiting circuit is coupled to the high supply side of the power supply.

14. An extended bandwidth low voltage protection circuit for protecting a test signal path from overvoltage test signals and test signals containing voltage transients, the extended bandwidth low voltage protection circuit comprising:

(a) a capacitance isolation circuit having:
 (i) an interior side that is electrically coupled to the test signal path;
 (ii) a high exterior side;
 (iii) and a low exterior side for isolating the test path from capacitive coupling until the capacitive isolation circuit detects an excess voltage on the test signal path and shunts the current created by the excess voltage;

(b) a voltage limiting circuit having a high limiting side and a low limiting side; and (c) a clamp circuit having an electrical capacitance, the clamp circuit comprising:
 (i) a high interior side that is coupled to the high exterior side of the capacitance isolation circuit;
 (ii) a low interior side that is coupled to the low exterior side of the capacitance isolation circuit;
 (iii) a high exterior side that is coupled to the high limiting side of the voltage limiting circuit; and
 (iv) and a low exterior side that is coupled to the low limiting side of the voltage limiting circuit;

said capacitance isolation circuit isolating the electrical capacitance of the clamp circuit from the test signal path unless the capacitance isolation circuit detects an excess voltage on the test signal path; and said capacitance isolation circuit conducting the current created by an excess voltage on the test signal path to the clamp circuit which shunts the current to the voltage limiting circuit when said capacitance isolation circuit detects an excess voltage on the test signal path.

15. The protection circuit of claim 14 wherein the capacitance isolation circuit comprises:

(a) a guard signal circuit having an input coupled to the test signal path, the guard signal circuit producing a guard signal that follows a test signal on the test signal path within an upper signal limit and a lower signal limit;

(b) a test signal path isolation circuit, comprising;
 (i) a first diode, the cathode of the first diode coupled to the test signal path and the anode of the first diode coupled to receive the guard signal; and
 (ii) a second diode, the anode of the second diode coupled to the test signal path and the cathode of the second diode coupled to receive the guard signal.

16. The protection circuit of claim 15 wherein the capacitance isolation circuit further comprises a first electrically-conductive guard path positioned on a first side of the test signal path, the first electrically-conductive guard path being coupled to receive the guard signal.

17. The protection circuit of claim 16 wherein the capacitance isolation circuit further comprises a second electrically-conductive guard path positioned on a second side of the test signal path, the second electrically-conductive guard path being coupled to receive the guard signal.

18. The protection circuit of claim 15 wherein the guard signal circuit comprises a non-inverting unity buffer circuit having an input coupled to the test signal path and an output that produces a buffered equivalent of the test signal.

19. The protection circuit of claim 18 wherein the non-inverting unity buffer circuit comprises:

power supply having a high supply side and a low supply side;

a third protective resistor;

a fourth protective resistor; and an operational amplifier, having:
 a high side power connection coupled to the high supply side of the power supply;
 a low side power connection coupled to the low side of the power supply; and
 a non-inverting input coupled to the test signal path through the third protective resistor;
 an output coupled to the anode of the first diode and the cathode of the second diode through the fourth protective resistor; and
 an inverting input coupled to the output.

20. The protection circuit of claim 19 wherein the upper signal limit is based on the high side power connection and the lower signal limit is based on the low side power connection.

21. The protection circuit of claim 15 wherein the clamp circuit comprises:

a third diode, the anode of the third diode coupled to the low voltage limiting circuit and the cathode of the third diode coupled to receive the guard signal; and a fourth diode, the cathode of the fourth diode coupled to the high voltage limiting circuit and the anode of the fourth diode coupled to the cathode of the third diode.

22. The protection circuit of claim 21 wherein the low voltage limiting circuit is coupled to the low supply side of the power supply and the high voltage limiting circuit is coupled to the high supply side of the power supply.

23. The protection circuit of claim 15 further comprising:

a test signal limiting circuit, comprising:
 a first protective resistor electrically coupled in series in the test signal path; and
 a first bandwidth-extending capacitor coupled in parallel with the first protective resistor.

24. The protection circuit of claim 23 wherein the test signal limiting circuit further comprises:

a second protective resistor electrically coupled in series in the test signal path; and a second bandwidth-extending capacitor coupled in parallel with the second protective resistor.

25. The protection circuit of claim 24 wherein the test signal limiting circuit further comprises a switch that breaks the test signal path when open so that the test signal is not applied to the capacitance isolation circuit and the guard signal circuit.

26. A protection circuit, comprising:

a high-bandwidth current limiting subsystem, comprising
 current limiting means for limiting a current in a test signal path;
 bandwidth expansion means coupled to the current limiting means for improving the frequency transmission capability of the test signal path containing the current limiting means;
 capacitance isolation means coupled to the test signal path for isolating the test signal path from a capacitance external to the test signal path; and overvoltage clamp means coupled to the capacitance isolation means for shunting excess current from the test signal path to a voltage limiting means.

27. The protection circuit of claim 26 wherein the capacitance isolation means further comprises a guard signal means coupled to the test signal path for producing a buffered guard signal in response to a test signal present on the test signal path, the buffered guard signal following the test signal within boundaries defined by an upper signal limit and a lower signal limit; the guard signal being coupled to the clamp isolation means so that the capacitance isolation means isolates the test signal path from the parasitic capacitance of the overvoltage clamp means when the test signal present on the test signal path is between the upper signal limit and the lower signal limit.

28. The protection circuit of claim 27 wherein the capacitance isolation means further comprises a guard path means for isolating the test signal path from parasitic capacitance that would otherwise be capacitively coupled to the test signal path, the guard path means including a guard path that is connected to the guard signal so that no meaningful differential in voltage appears between the test signal path and the guard path, thereby minimizing the effect of any capacitance that may be capacitively coupled to the test signal path and to the guard path.

29. The protection circuit of claim 28 further comprising multiple guard paths that surround the test signal path.

30. The protection circuit of claim 29 further comprising measurement means coupled to the test signal path for measuring the voltage of a test signal present in the test signal path.

31. The protection circuit of claim 29 further comprising measurement means coupled to a test signal path for measuring the frequency of the test signal present in the test signal path.

32. The protection circuit of claim 29 further comprising measurement means coupled to the test signal path for measuring the current of a test signal present in the test signal path.

33. The protection circuit of claim 28 further comprising surge protection means coupled to the test signal path for shunting voltages exceeding the peak voltage rating of the capacitance isolation means and the overvoltage clamp means to the voltage limiting circuit.

34. The protection circuit of claim 33 further comprising switch means for isolating sections of the test signal path.

* * * * *

UNITED STATES PATENT AND TRADEMARK OFFICE
CERTIFICATE OF CORRECTION

PATENT NO. : 6,163,445
DATED : December 19, 2000
INVENTOR(S) : R.D. Zoellick

It is certified that error appears in the above-identified patent and that said Letters Patent is hereby corrected as shown below:

Column 2, page 1,
Attorney, Agent, or Firm, "Christen" should read -- Christensen --

Column 12,
Line 20, (Claim 6, line 7) "coupled the guard" should read -- coupled to the guard --

Column 14,
Line 7, (Claim 19, line 3) "power supply" should read -- a power supply --
Line 58, (Claim 26, line 2) "comprising" should read -- comprising: --

Signed and Sealed this

Sixteenth Day of October, 2001

Attest:

NICHOLAS P. GODICI
*Attesting Officer*     *Acting Director of the United States Patent and Trademark Office*